(12) United States Patent
Knijnik et al.

(10) Patent No.: US 9,244,114 B2
(45) Date of Patent: Jan. 26, 2016

(54) SYSTEM AND METHOD FOR ASSESSING FAULTY POWER-LINE INSULATOR STRINGS

(71) Applicant: METRYCOM COMMUNICATIONS LTD., Tel Aviv (IL)

(72) Inventors: Roman Knijnik, Haifa (IL); Daniel Kottick, Karmiel (IL); Leonid Maslovski, Kiryat Motskin (IL); Eduard Wolfson, Haifa (IL); Liron Frenkel, Netanya (IL)

( * ) Notice: Subject to any disclaimer, the term of this patent is extended or adjusted under 35 U.S.C. 154(b) by 499 days.

(21) Appl. No.: 13/726,266

(22) Filed: Dec. 24, 2012

(65) Prior Publication Data

US 2013/0179099 A1 Jul. 11, 2013

Related U.S. Application Data

(60) Provisional application No. 61/584,259, filed on Jan. 8, 2012.

(51) Int. Cl.
*G01R 31/08* (2006.01)
*G01R 31/02* (2006.01)
*G01R 31/12* (2006.01)

(52) U.S. Cl.
CPC .......... *G01R 31/088* (2013.01); *G01R 31/1245* (2013.01); *G01R 31/024* (2013.01)

(58) Field of Classification Search
CPC ............. G01R 19/2513; G01R 31/024; G01R 31/088; G01R 31/1245
USPC ................ 702/57, 58, 60, 61, 64, 65; 340/657
See application file for complete search history.

(56) References Cited

U.S. PATENT DOCUMENTS 8,665,102 B2 * 3/2014 Salewske et al. ............. 340/657

FOREIGN PATENT DOCUMENTS

CN       1306213 A       1/2000
JP      2006305564      11/2006

* cited by examiner

*Primary Examiner* — John H Le

(57) ABSTRACT

A system for the detection of discharges over high voltage power-line insulator strings of an electrical grid. A sensor unit is deployed on a non conducting cable of the grid. The sensor feeds an array of band cut-off filters receiving each signals from said at least one sensor unit. An analogue processor is associated with each of the band cut-off filters associated each with a current peak detector. An ADC unit is associated with each one of said analogue processors. In addition a digital processor is provided for calculating data received from each one of the ADCs and one radio transmitter unit sends data to a gateway of a network. A digital processor is adapted to send data processed based on the output of the ADCs, to the radio transmitter for conveying the data to processor associated with a WAN.

7 Claims, 4 Drawing Sheets

SYSTEM AND METHOD FOR ASSESSING FAULTY POWER-LINE INSULATOR STRINGS

CROSS-REFERENCE TO RELATED PATENT APPLICATIONS

This application claims priority from U.S. provisional patent application 61/584,259 entitled "System and method for prediction of flashovers over high voltage power-line insulator strings", filed on Jan. 8, 2012.

FIELD OF THE INVENTION

The present invention relates to monitoring transmission power lines of an electrical grid, and specifically, to quantifying occurrences of flashovers over contaminated power line isolators.

BACKGROUND OF THE INVENTION

Contamination over power line insulator-strings is a major source of power quality impairment. Such contamination can cause flashovers, which result in shortcuts and wide-area power sags (instantaneous voltage level drop). This causes significant damage to industrial power consumers. Electrical companies invest significant resources on washing insulator strings using helicopters and from the ground. Currently, the maintenance crews cannot get a view of the contamination level in power transmission and distribution lines, and selecting the sections that needs to be washed is based mainly on the experience of the maintenance teams.

Different systems and methods have been proposed in the past for detecting contamination over power line insulators. Most of the methods are using a dedicated sensor per each insulator string—for example see Yuan Jing, Chinese patent CN1306213A. These methods are not cost efficient as there are many strings per each tower, and many devices need to be purchased and deployed.

Other methods include using pilot isolators, which are used to sample contamination, for example see Baba Motoharu, JP patent number JP2008123805A. Since pilot insulators are used for prediction of contamination instead of using data from the actual insulator strings of the power-transmission system, these methods can offer only a limited level of prediction of flashovers on the actual transmission system.

It is well known, that partial discharges are developed over contaminated or damaged insulator string before a flashover occurs, and some prior art methods detect pulses which result from partial discharges over the insulator string in order to predict flashovers over the insulator strings. However, these methods do not prove efficient algorithms for localizing a contaminated insulator, generating partial discharges pulses, and therefore many sensors need to be deployed in order to estimate the location of the contaminated insulator, typically at least one sensor per tower. This increases the cost of the solution. Some prior art methods apply a threshold in order to count PD (partial discharge on the surface of insulators) pulses. This scheme requires setting the threshold in advance, and precludes post-measurement analysis.

SUMMARY OF THE INVENTION

It is an object of the present invention to provide improved devices and methods for prediction of flashovers over power line insulator strings.

It is a further object of some aspects of the present invention to provide an improved method for guiding the maintenance teams to the most sensitive segments of the power lines at the optimal time, thereby reducing the total washing operations and associated costs, and increase the power quality by reducing the number of flashovers and resulting power sags.

In embodiments of the present invention, a current sensor is placed typically on the ground wire of a transmission line, which is further used to sense discharges on the power line. The sensor and its installation method allow a remote and accurate measurement of the discharge pulses, obviating the need for complex calibration as in some prior art methods. In other embodiments of the present invention, the unit is placed on the electric tower, and an antenna or a wire is used to receive the signals.

In accordance with the present invention, a server uses data received from the signal processor to estimate the location of the contaminated or structurally defective insulator string, which is a source of the PD pulses. The signal processor applies spectral analysis in order to determine the distance between the sensor and the contaminated insulator string.

In some embodiments of the present invention, the signal processor is coupled with low-power peak-detectors and applies low rate A/D sampling, for low power consumption.

In a embodiment of the present invention, a wireless multi-hop communication system carries the data from the signal processor to the server, where the data of all the sensors is stored.

In a embodiment of the present invention, the system is power-fed by harvesting energy from currents induced in the ground wire.

BRIEF DESCRIPTION OF THE DRAWINGS

The present invention will be understood and appreciated more fully from the following detailed description taken in conjunction with the appended drawings in which.

DETAILED DESCRIPTION OF THE INVENTION

Illustrative embodiments of the invention are described below. In the interest of clarity, not all features/components of an actual implementation are necessarily described.

Figure 1:
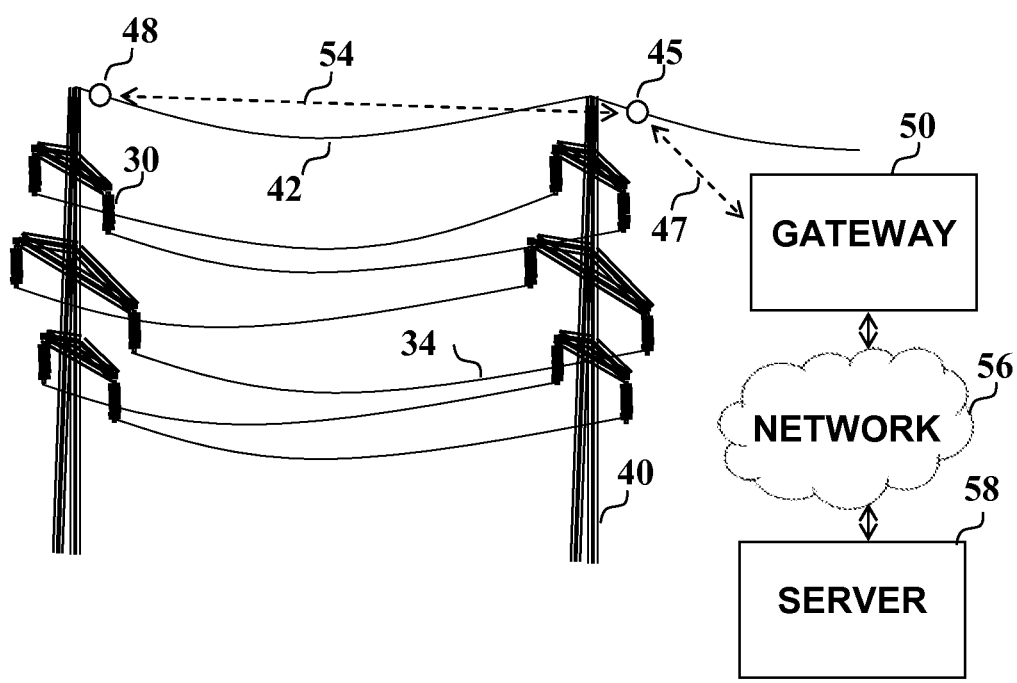
FIG. 1 is a schematic description of the electrical grid layout in which the present invention is implemented.

Reference is first made to FIG. 1, in which insulator strings such as insulator string 30, retain power wires such as power wire 34 in a suspended state. In some situations, a faulty or contaminated insulator string 30 is conducive to the development of partial discharges over the insulator strings. These partial discharges generate electromagnetic pulses, which are induced into the power wires such as power wire 34, tower 40 and ground wire 42.

According to a embodiment of the present invention, a sensor unit 45 is deployed on the ground wire 42, typically every one to three kilometers, which is capable of measuring the current pulses in the ground wire originating in the insulator string 30. The ratio between the magnitude of the partial discharge over the contaminated insulator string 30 and the current pulse which is induced in the ground wire 42 depends mostly on the structure of the transmission line, and does not vary considerably among different insulators which reside on the same tower. This makes it possible to detect pulses originating in different insulator strings in a similar way.

Sensor unit 45 receives current pulse signals created by partial discharge events occurring in insulator string 30, processes these received pulse signals, records the results, and sends digital records of them to the gateway using a transmission link 47. Such a communications link may be a radio link but it may also be accomplished by employing a physical line. Sensor unit 48 has the same functionality as sensor unit 45, with the exception that it sends the information to the gateway 50 through sensor unit 45 since it does not have a direct radio link with the gateway 50. This indirect communications arrangement is referred to in the art as two hop or multi hop transmission. In case there are more than one intermediate stations involved, the transmission may be regarded as two, three or multi hop transmissions respective of the number of stops the signal encounters. In this example sensor unit 45 functions also as a router. In the same way, additional sensors can be deployed further away from the gateway 50, and route information from sensor to sensor until reaching the gateway 50. The sensors 45, 48 can be located on each electric tower or with larger spacing 54 (e.g. each 4 electric towers). The data from gateway 50 is sent through a standard network connection 56 to a server 58 which stores the data and performs further analysis.

Figure 2:
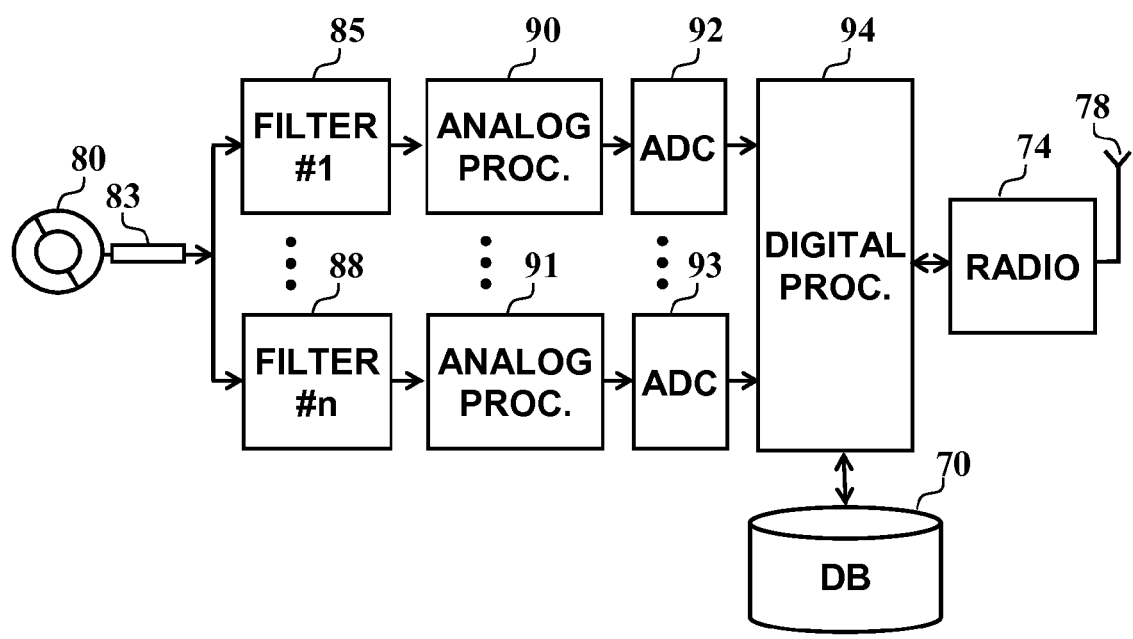
FIG. 2 is a block diagram of the sensor unit, responsible for measuring current pulse signals in the ground wire, processing them and sending them.

FIG. 2 is a block diagram of a combined sensing and processing unit such as unit 45. Such a unit is responsible for measuring current pulse signals which flow in the ground wire, resulting from partial discharge events. The unit also processes those signals, stores the results in a database 70 and send the results or analytic data based on them using a radio transmitter 74 and an associated antenna 78. Although a radio communications link seems to be a preferred method of transmitting the data from the sensing and processing unit 45, the obtained data may be transmitted using a physical line having appropriate adapters at both ends, for conveying the digital data from unit 45 to gateway 50. The current pulse signals which flow in the ground wire are measured by employing a current transformer 80, which is installed around the ground wire 42 as a clamp. The core of the current transformer 80 is typically made of two halves of a toroid. The received pulse signal then flows though a coaxial cable 83. According to an embodiment of the present invention, the current transformer and the coaxial cable are packaged together with the other components of the sensor unit. According to a different embodiment of the present invention, the current transformer resides in a first stand-alone packaging, and the other components of the sensor unit resides in a second stand alone package that can be located on a lower location of transmission tower 40 and connect to the first stand-alone enclosure by the coaxial cable 83.

The output signal of the coaxial cable 83 is fed into an array of different band cut-off filters such as bandpass or highpass filters (for example 85 and 88). In an atypical cases, only one filter is employed in the array. Each band cut-off filter (BCOF) is capable of passing a different frequency band. The output of BCOFs 85, 88 etc. is processed by respective analogue processors 90, 91, which include each a peak-detector that measures the largest signal peak to be measured since its last reset. ADCs 92 and 93 sample the output of the respective peak detectors associated each e analogue processors 92, 93 etc., periodically as predefined (e.g. each second), and resets the peak detector after each sampling. This scheme allows for a low power consumption, implementing a low sampling rate of the respective ADCs, and the peak detectors are implemented by low-power components, e.g. by a diode and CMOS operational amplifiers. According to an embodiment of the present invention the ADCs sample all the bands when one of the bands crosses a predefined minimum threshold. The samples of the different ADCs are then sent to the digital processor 94, which creates a histogram of the samples, by defining amplitude intervals (e.g. 0V-1V, 1V-2V, 2V-3V, 3V-4V etc). The histograms are then sent to the server via the other sensor units, the gateway 50 and the network 56.

In a embodiment of the present invention, the system is power-fed by harvesting energy from currents induced in the ground wire. Power harvesting is achieved by placing a low-frequency current transformer clamp around the ground wire, rectifying the induced current, and utilizing the rectified current to charge a capacitor or a battery. In a embodiment of the present invention, the current transformer is located near the PD sensor on the same ground wire and packaged in a single package which is mounted on the ground wire, thus achieving a combined PD detection and power feeding without the need for external power or primary battery.

In some embodiments of the present invention, current sensor 80 is deployed on the ground wire 42. In other embodiments of the present invention, current transformer 80 is deployed on a non conducting wire, such as the wire connecting between a location along the transmission tower 40 and the ground, or between two points on the transmission tower. In such a case current transformer 80 can be replaced by a high frequency transformer, e.g. in the range 2-60 MHz. In another embodiment of the invention, an antenna (e.g. in the range of 2-10 MHz) can be used instead of current transformer 80. The antenna can be mounted on the transmission tower in order to sense the electromagnetic signals induced by the PD. In another embodiment of the present invention a variety of antennas can be deployed, each one matching a respective BCOF such as BCOFs 85 and 88.

Flashover detection and statistical analysis of significance of the samples for assessing fallibility of insulator strings.

In a embodiment of the present invention, the signal processor includes a comparator, which compares amplitudes of the received PD pulses to multiple threshold levels, and counts the number of pulses between each two consecutive thresholds in order to form histograms of the amplitudes of the received PD pulses over a predefined period of time. These histograms are sent to the server.

The frequency distribution of the output of an analogue processor P1 output, which in a typical case is a summation of 5 minutes in which peaks of volts were measured each second, sum up to 300 measured peaks. The frequencies of peaks are ordered in a form of a histogram such that the space between 0 to typically 32 volts is divided into intervals wherein each interval is represented by a rectangular bar the height of which representing the frequency of peaks occurring in the interval. In order to exclude outliers, i.e. values which are deemed unreasonable, several methods can be implemented for automatic exclusion or deletion. For example, the bar in the histogram representing the highest voltage peaks can be discarded (excluded), in another method, all the bars representing the 90% of the peak values are kept and the higher bar/s discarded (excluded). The reason for the experimental finding of extreme peak values can be attributed to either irregular origins (e.g. lightnings, power surges due to irregular switching).

In one aspect of the present invention, referring to FIG. 1 again, server 58 receives the histograms to predict future flashover occurrence based on recent data and historical data of sensors in the system. Typically, for assessing the fallibility of insulator strings, multiple 5 minute histograms are processed. In tested working situations, 6 to 8 five minute measurements are made in a day, each day in a week.

The flashover risk at a certain location is conveniently defined in terms of levels, e.g.: "High", "Medium" and "Low". In an embodiment of the present invention, the flashover risk level is calculated using the 90% percentile value of the amplitude distribution of the respective received PD pulses. Thus for a 90% percentile above a certain threshold value, the flashover risk is high, for another, lower value of the 90% percentile value the risk is medium etc. Further information for calibrating the fallibility of insulators is obtained, usually in advance in the laboratory by applying high voltage to contaminated insulators of the same type, and recording level of PD pulses as described above.

In another embodiment of the present invention, the flashover risk level is determined at a certain location by comparing the value of the 90% percentile of the histogram with the value of the 50% percentile of the histograms. The higher the ratio of the 90% percentile to 50% percentile is, the higher the risk. The advantage of this method is that it does not depend on absolute signal levels and does not relate to calibration data. The 50% percentile represents a percentile selected as a result of empirical studies, however, another percentile may be selected for that matter, typically close to the 50% percentile.

In some embodiments of the present invention, the server uses data from flashover recording systems. When a flashover event takes place, the algorithm normalizes the thresholds of the risk levels accordingly, in order to correlate "high" threshold levels with actual flashover. This calibration scheme is dynamic and constantly updates the threshold level, typically every few weeks.

In some embodiments of the present invention, the following method is used for calibrating the thresholds: Optical inspection of insulator strings is performed at selected locations. Partial discharges can be observed in the visible spectrum or in the ultraviolet spectrum as light pulses covering a part of the insulator string. The "medium" threshold can be set to a level of PD pulses related to PD covering about 10%-30% of the insulator string, and "high" threshold can be set to a level of PD pulses related to PD covering more than 30% of the insulator string.

In a embodiment of the present invention, only signals that are sampled simultaneously by the ND on more than a single output of a BCOF are taken into account. This method allows filtering of narrow-band interferences.

In one aspect of the invention, the server uses data received from the signal processor to estimate the location of the contaminated or defected insulator string, which is the source of the PD pulses. The signal processor sends to the server histograms related to different frequency bands. Since the PD signal is a wide band pulse, it includes low frequency components, such as in the range of tens of MHz. If the PD source is far away, the high frequency components will have decayed by the time they reach the sensor, due to the inherent attenuation profile of the transmission lines favouring lower attenuation of lower frequency signals.

An exemplary algorithm which can be implemented in the digital processor 94 or in server 58 therefore divides the amplitude of the high frequency BCOF sampled by ADC 92 by the amplitude produced by the low frequency BCOF sampled by ADC 93, to estimate the distance of the contaminated insulator string form the ratio of these amplitudes. For example, a ratio of about 3 may indicate that the contaminated string is in the same transmission tower of the sensor, and a ratio below 1 may indicate that the contaminated insulator string is located on a remote transmission tower. The ratio can be calculated separately for each pair of samples at the ADCs 92 and 93 in order to detect multiple sources which differ in the ratio and in the amplitudes of the samples. In a different implementation of the present invention, two different histograms are created, one for each frequency band (92, 93), for each such histogram the 90% percentile value is calculated, and the range of the contaminated insulator is estimated from the ratio of the two calculated values. In both cases, outlier such as infrequent sample values are to be be ignored in order to eliminate unwanted signals like lightning strikes or switching interruptions, which are less frequent than native measured PD pulses.

Figure 3:
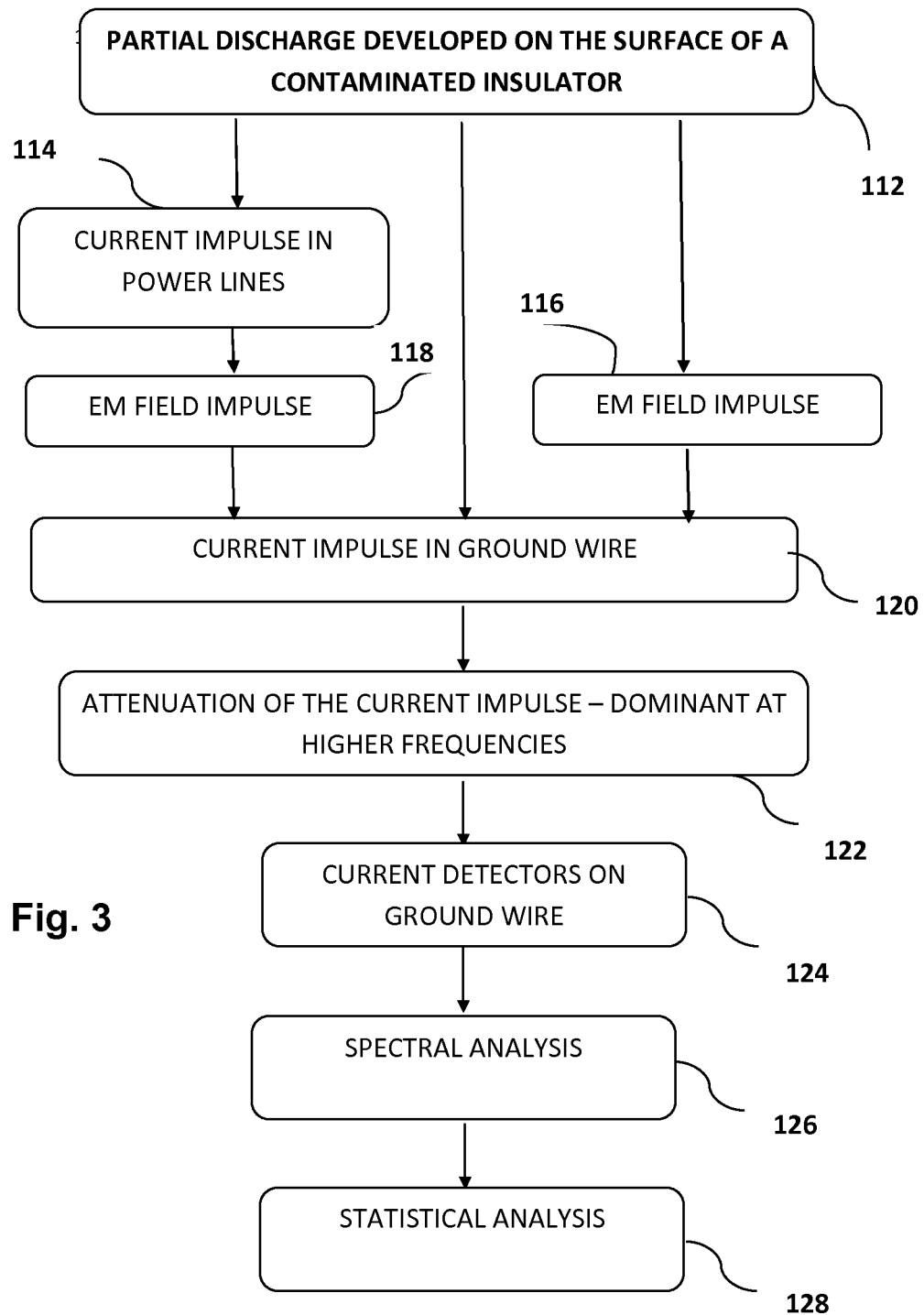
FIG. 3 is a generalized summary of the flow of events taking place in response to partial discharge occurrence in accordance with the present invention.
Figure 4:
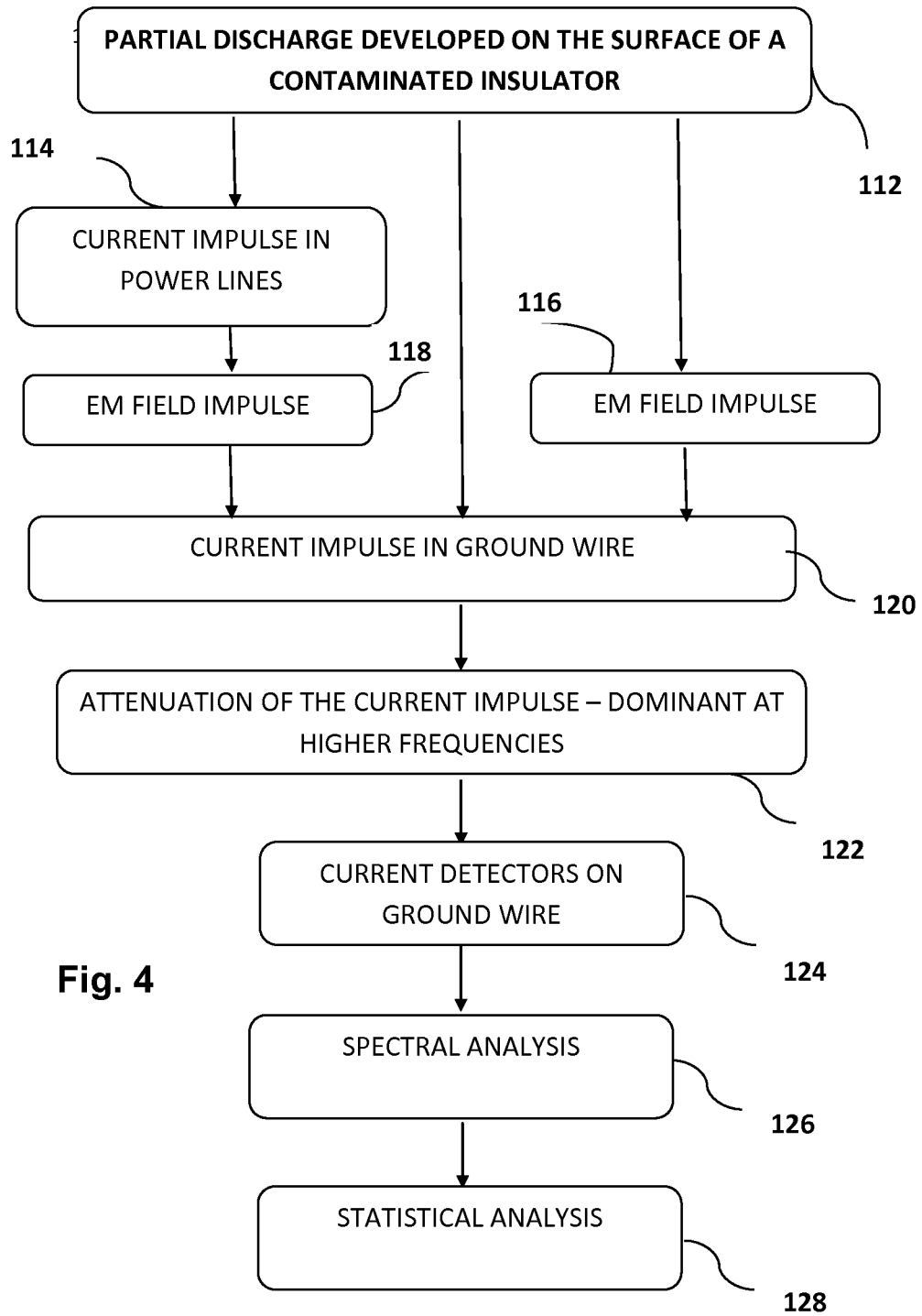

An event flow diagram in FIG. 3 summarizes both the physical framework and steps that a method of the invention accomplishes in order to find and define the faulty insulators. In step 112 a partial discharge develops on a surface of an insulator, typically as a result of contamination. In step 114 a current impulse in the power line associated with insulator develops. In addition in step 116 an electromagnetic (EM) field develops as a result of the partial discharge occurring. A different source of electromagnetic field is the current impulses which give rise to secondary electromagnetic fields in step 118. In the ground wire currents develop in response to all the above EM fields, currents and partial discharge at step 120. Further, in step 122 attenuation of the currents impulses takes place, which can be detected preferentially decreasing the higher frequency power passed to detectors deployed on ground wire 124. A spectral analysis of the currents provides grounds for assessing the relative distance that the source discharge detectors are situated from the discharge. Statistical analysis in step 128 is implemented to assess the risk of flashovers at specific sites on the grid.

What is claimed is:

1. A system for the detection of discharges over high voltage power-line insulator strings of an electrical grid in which wires are deployed supported by towers, said device comprising:
    at least one sensor unit associated with a non conducting wire of said grid;
    an array of at least one band cut-off filter (BCOF) receiving each signals from said at least one sensor unit;
    an analogue processor per each of said at least one BCOFs each of which having associated with a peak detector;
    analogue to digital converter (ADC) unit per each one of said analogue processors;
    a digital processor for calculating data received from each of said at least one of said ADCs;
    a communications link for sending data to a gateway of a network, and wherein said digital processor is adapted to send data processed based on output of said ADCs, to a server for further processing.

2. A system as in claim 1, wherein said non-conducting wire is a ground wire.

3. A system as in claim 1, wherein said non-conducting wire is a wire connecting between a tower and the ground.

4. A system as in claim 1, wherein at least said analogue and said digital processors are power fed by currents induced in a non conducting wire.

5. A system as in claim 1, wherein said communications link is radio link.

6. A system as in claim 5 wherein said radio link is multi-hop link.

7. A system as in claim 1 wherein said at least one sensor and said array of BCOFs and said analogue processors and said ADC converters and digital processor all relating to the same sensor are packaged together.

* * * * *